United States Patent [19]

Matsuki

[11] Patent Number: 5,594,272
[45] Date of Patent: Jan. 14, 1997

[54] BIPOLAR TRANSISTOR WITH BASE AND EMITTER CONTACT HOLES HAVING SHORTER CENTRAL PORTIONS

[75] Inventor: Junichi Matsuki, Yamagata, Japan

[73] Assignee: NEC Corporation, Tokyo, Japan

[21] Appl. No.: 494,707

[22] Filed: Jun. 26, 1995

[30] Foreign Application Priority Data

Jun. 27, 1994 [JP] Japan .................................... 6-144226

[51] Int. Cl.⁶ ........................ H01L 27/082; H01L 23/057
[52] U.S. Cl. .......................... 257/579; 259/578; 259/580; 259/581; 259/582
[58] Field of Search ..................................... 257/578, 579, 257/580, 583, 582, 581

[56] References Cited

U.S. PATENT DOCUMENTS 5,270,568   12/1993   Terashima .............................. 257/490

Primary Examiner—Sara W. Crane
Assistant Examiner—Fetsum Abraham

[57] ABSTRACT

An insulating film formed on a base region is patterned to form emitter contact holes and base contact holes arranged alternately in such a manner that those contact holes are short in the center portion and become longer toward the peripheral portions, and to form emitter regions which are aligned with the emitter contact holes. This structure can suppress the current concentration on the center portion of a transistor without using a ballast resistor, thus ensuring a high-output operation, and can improve the transfer gain. The elimination of such a ballast resistor results in an increased effective utilization area and a simplified fabrication.

2 Claims, 2 Drawing Sheets

BIPOLAR TRANSISTOR WITH BASE AND EMITTER CONTACT HOLES HAVING SHORTER CENTRAL PORTIONS

BACKGROUND OF THE INVENTION

1. Field of the Invention

The present invention relates to a bipolar transistor and, more particularly, to a high-frequency high-output transistor.

2. Description of the Related Art

To acquire a large output from a high-frequency high-output transistor, the large current is controlled by arranging multiple unit transistors in parallel to each other and the density of currents flowing through the individual unit transistors is made uniform to prevent thermal breakdown otherwise caused by the local concentration of the current.

FIG. 1A is a plan view of a semiconductor chip exemplifying a conventional bipolar transistor, FIG. 1B is an enlarged cross-sectional view along the line B—B' in FIG. 1A, and FIG. 1C is an enlarged cross-sectional view along the line C—C' in FIG. 1A.

As shown in FIGS. 1A through 1C, a p-type base region 2 is formed on one major surface of an n-type silicon substrate 1. An insulating film 3 is formed on the surface of this base region 2. The insulating film 3 on the base region 2 is selectively etched to form stripe-shaped emitter contact holes 5 and base contact holes 4 arranged alternately. A polycrystalline silicon (polysilicon) layer 6 containing an n-type impurity is provided in each contact hole 5. The impurity in the polysilicon layer 6 is diffused to the surface of the base region 2, forming an $n^+$-type emitter region 7. A diffusion layer 12 made of a polysilicon layer is formed on the insulating film 3 adjacent to the base region 2. The diffusion layer 12 has a shape narrow in the center and wide at both ends. Formed in an insulating film 8 that covers the diffusion layer 12 are stripe-shaped contact holes 9. The contact holes 9 are short in the center portion of the diffusion layer 12 and become longer toward both end portions thereof. A metal film made of aluminum or the like is deposited on the surface of the resultant structure, including the polysilicon layers 6, the base contact holes 4 and the contact holes 9, and is then patterned, yielding a comb-shaped base electrode 11 which contacts the base region 2 in the base contact hole 4. Further formed are first emitter electrodes 13 which connect the polysilicon layers 6 to the resistor layer 12 under some contact holes 9. A comb-shaped second emitter electrode 14 is formed which connects to the resistor layer 12 in the other contact holes 9 than those connected with the emitter electrodes 13. The emitter regions 7 are connected to the second emitter electrode 14 via the first emitter electrodes 13 and ballast resistors whose resistances are determined by the width of the resistor layer 12 and the size of the contact holes 9. More specifically, the intervening ballast resistors have a high resistance in the center portion and a low resistance at the peripheral portion. This particular connection of the emitter regions 7 suppresses the current flowing in the center portion of the transistor, thus accomplishing the uniform operation of the unit transistors.

Since the conventional bipolar transistor has a ballast resistor connected in series to the associated emitter electrode in order to suppress the local current concentration on the center portion of the transistor, the forward transfer gain is undesirably decreased.

The formation of the ballast resistor requires a large area for forming the resistor layer in a region adjacent to the base region. This reduces the ratio of the effective utilization area of the semiconductor chip and needs an additional step for forming the ballast resistor, thus increasing the manufacturing cost.

SUMMARY OF THE INVENTION

Accordingly, it is an object of the present invention to provide a bipolar transistor which is designed to suppress thermal-unbalance oriented current concentration on the center portion without using a ballast resistor to thereby ensure a high-output operation, and which can ensure a greater effective utilization area ratio of a semiconductor chip so that the semiconductor chip can provide a greater output for the same effective utilization area, as compared with the conventional transistor.

A bipolar transistor according to this invention comprises a base region formed on one major surface of a semiconductor substrate of one conductivity type, the base region having an opposite conductivity type to that of the substrate; an insulating film provided on a surface including the base region; stripe-shaped emitter contact holes and base contact holes formed alternately in the insulating film on the base region in such a way that the emitter contact holes and base contact holes are short in a center portion of the base region and become longer toward both ends of the base region; emitter regions formed on a surface of the base region in alignment with the emitter contact holes; and an comb-shaped emitter electrode and an comb-shaped base electrode respectively connected to the emitter regions and the base region.

According to this invention, since the stripe-shaped emitter regions which are short in the center portion and become longer toward both ends is formed, the thermal-unbalance oriented current concentration on the center portion can be suppressed without using a ballast resistor, thereby ensuring a high-output operation. This invention can improve the forward transfer gain of a transistor having a gain-bandwidth produce of 6 GHz by about 1 to 1.5 dB as compared with the transistor which uses a ballast resistor.

The elimination of a ballast resistor can increase the effective utilization area ratio of a semiconductor chip, thus allowing a semiconductor device with a larger output to be formed by a semiconductor chip having the same area as the conventional semiconductor chip, and can simplify the fabrication of the transistor.

DETAILED DESCRIPTION OF THE PREFERRED EMBODIMENT

A bipolar transistor according to one embodiment of the present invention will now be described referring to the accompanying drawings.

Figure 1A:
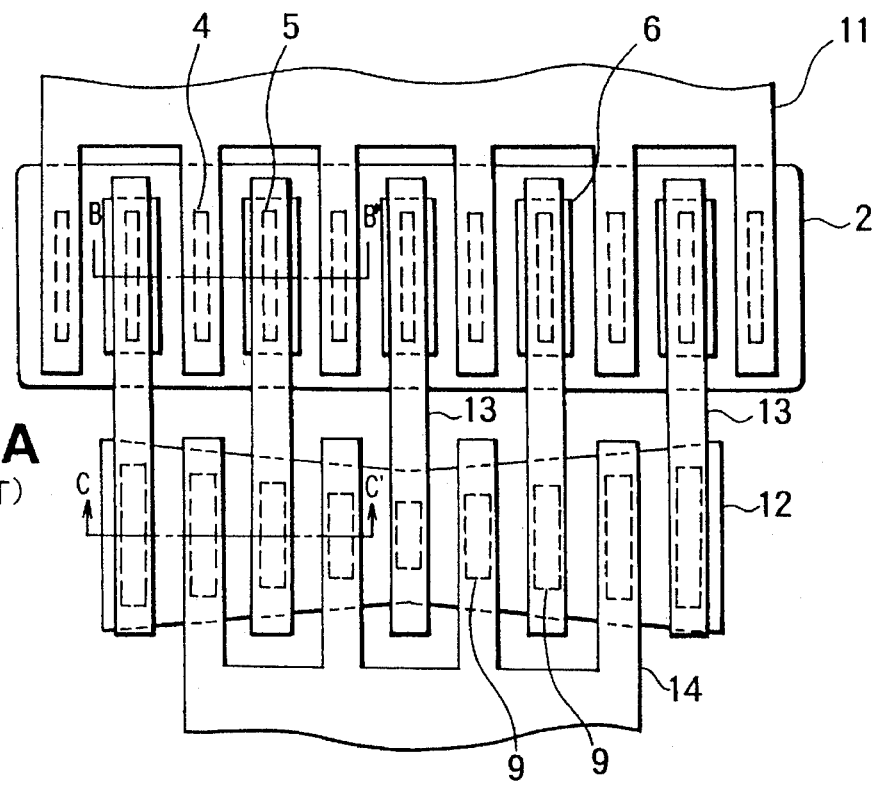
FIGS. 1A, 1B and 1C show one example of a conventional bipolar transistor, and are respectively a plan view of the bipolar transistor, an enlarged cross-sectional view along the line B—B' in FIG. 1A, and an enlarged cross-sectional view along the line C—C' in FIG. 1A.
Figure 1B:
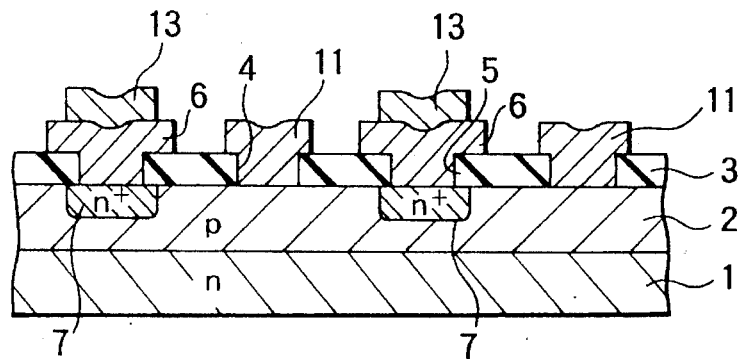
Figure 1C:
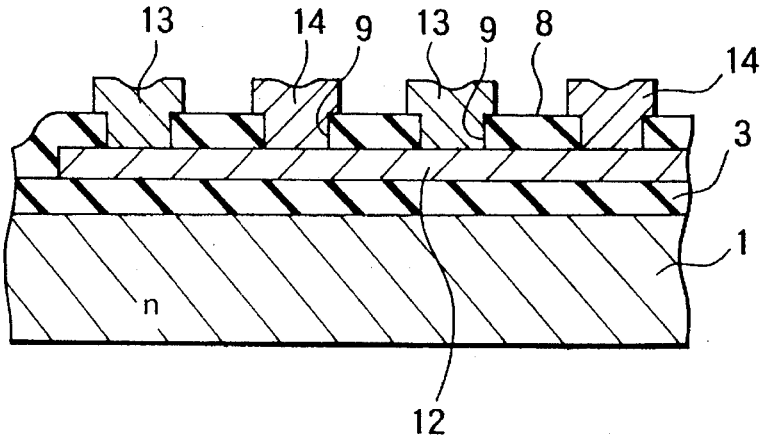
Figure 2A:
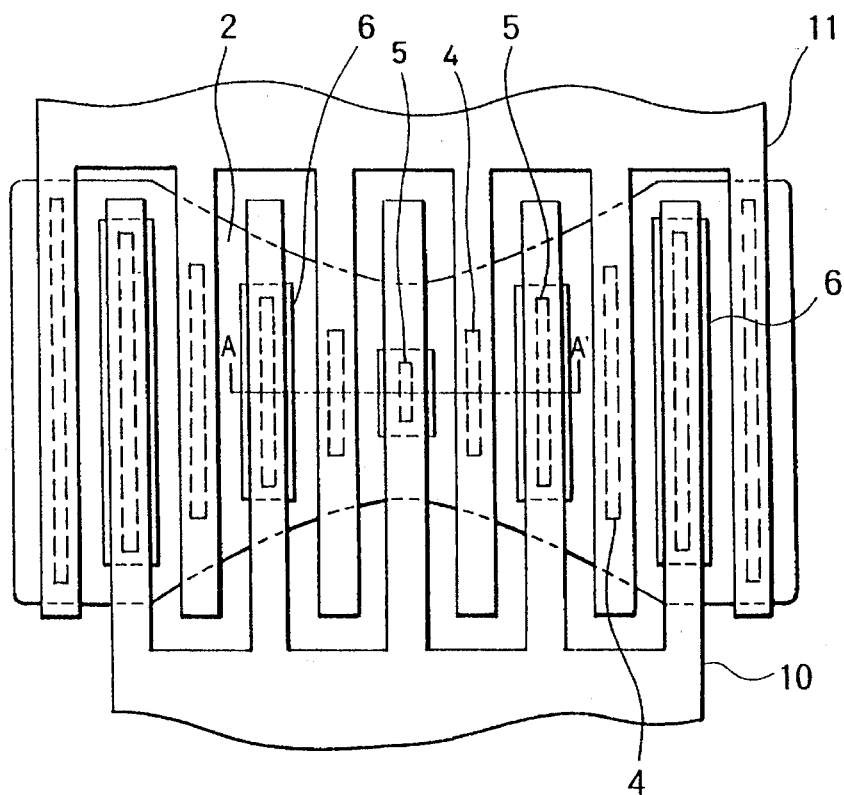
FIGS. 2A and 2B illustrate one embodiment of the present invention, and are respectively a plan view of a semiconductor chip and an enlarged cross-sectional view along the line A—A' in FIG. 2A.
Figure 2B:
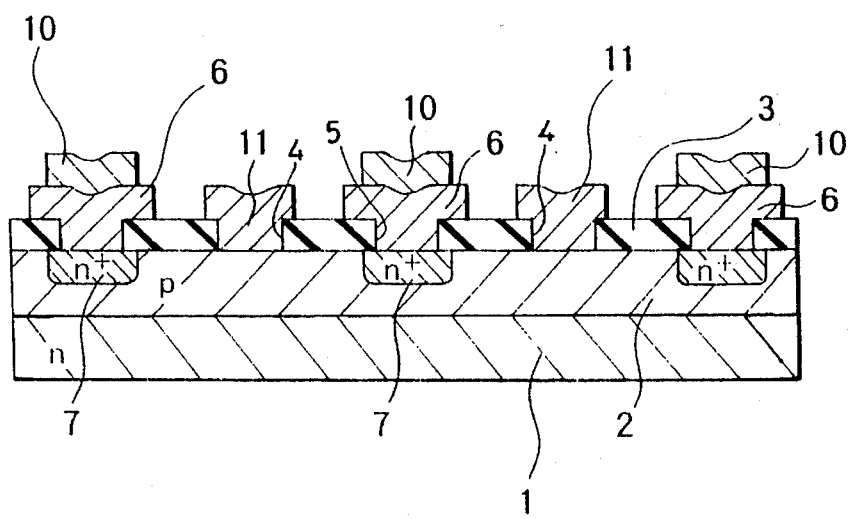

FIG. 2A is a plan view of a semiconductor chip illustrating one embodiment of this invention, and FIG. 2B is an enlarged cross-sectional view along the line A—A' in FIG. 2A. As shown in FIGS. 2A and 2B, after a bobbin-shaped p-type base region 2, which is narrow in the center portion thereof and becomes continuously wider toward the right and left ends, is formed on one major surface of an n-type silicon substrate 1, an insulating film 3 is formed on the surface including the p-type base region 2. Next, the insulating film 3 on the p-type base region 2 is. Selectively etched to form stripe-shaped emitter contact holes 5 and base contact holes 4 arranged alternately. The emitter contact holes 5 and base contact holes 4 are short in the center portion of the p-type base region 2 and become longer toward both ends thereof. A polysilicon layer containing an n-type impurity is deposited on the surface including those contact holes and is then patterned to form polysilicon layers 6 which extend along and around the emitter contact holes 5. Then, the resultant structure is subjected to a heat treatment to diffuse the impurity from the polysilicon layer 6 to the surface of the base region 2, forming an $n^+$-type emitter region 7. Next, a metal film of aluminum or the like is deposited on the surface of the resultant structure and is then patterned to form a comb-shaped emitter electrode 10, which is connected to the polysilicon layer 6, and a comb-shaped base electrode 11, which is connected to the base region 2 under the base contact holes 4.

According to this embodiment, the stripe-shaped emitter regions 7 formed in alignment with the emitter contact holes 5 are short in the center portion and become longer toward the peripheral portions, and the stripe-shaped base contact holes 4 arranged alternately with the emitter regions 7 are also short in the center portion and become longer toward both ends. It is therefore possible to suppress the current flowing in the center portion more than the currents flowing at both end portions of the transistor device. This prevents the unit transistor from malfunctioning due to the current concentration caused by a rise in virtual junction temperature in the center portion, and can ensure a stable high-output operation.

What is claimed is:

1. A bipolar transistor comprising:

a semiconductor substrate of one conductivity type;

a base region formed on one major surface of said semiconductor substrate, said base region having an opposite conductivity type to that of said substrate;

an insulating film provided on a surface including said base region;

stripe-shaped emitter contact holes and base contact holes formed alternately in said insulating film on said base region in such a way that said emitter contact holes and base contact holes are short in a center portion of said base region and become longer toward both ends of said base region;

an emitter region formed on a surface of said base region in alignment with said emitter contact holes; and a comb-shaped emitter electrode and a comb-shaped base electrode respectively connecting to said emitter region and said base region.

2. The bipolar transistor according to claim 1, wherein;

said base region is narrower in the center portion thereof and becomes continuously wider toward the both ends.

\* \* \* \* \*